United States Patent
Tsuda et al.

(10) Patent No.: US 8,213,209 B2
(45) Date of Patent: Jul. 3, 2012

(54) METHOD OF MANUFACTURING SEMICONDUCTOR DEVICE AND SEMICONDUCTOR DEVICE

(75) Inventors: Hiroshi Tsuda, Kanagawa (JP); Yoshitaka Kubota, Kanagawa (JP); Hiromichi Takaoka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 198 days.

(21) Appl. No.: 12/826,100

(22) Filed: Jun. 29, 2010

(65) Prior Publication Data

US 2011/0019494 A1 Jan. 27, 2011

(30) Foreign Application Priority Data

Jul. 23, 2009 (JP) ................. 2009-172246

(51) Int. Cl.
*G11C 5/00* (2006.01)
*G11C 17/18* (2006.01)
*G11C 8/00* (2006.01)
*H01L 23/52* (2006.01)
*H01L 21/336* (2006.01)

(52) U.S. Cl. ........ 365/52; 365/225.7; 365/226; 257/529; 438/281

(58) Field of Classification Search ............... 365/52, 365/225.7, 226; 257/529; 438/281
See application file for complete search history.

(56) References Cited

U.S. PATENT DOCUMENTS

| | | | | |
|---|---|---|---|---|
| 5,459,684 A | * | 10/1995 | Nakamura et al. | 365/225.7 |
| 5,576,554 A | * | 11/1996 | Hsu | 257/529 |
| 6,320,242 B1 | * | 11/2001 | Takasu et al. | 257/529 |
| 6,586,282 B1 | * | 7/2003 | Takasu | 257/529 |
| 6,963,511 B2 | * | 11/2005 | Ashizawa | 365/225.7 |
| 7,388,770 B2 | | 6/2008 | Namekawa et al. | |
| 7,413,936 B2 | * | 8/2008 | Azimi et al. | 438/281 |
| 7,443,755 B2 | * | 10/2008 | Choi | 365/225.7 |
| 2006/0158923 A1 | | 7/2006 | Namekawa et al. | |

FOREIGN PATENT DOCUMENTS

JP 2006-196079 7/2006
JP 2006-310829 11/2006

* cited by examiner

*Primary Examiner* — Trong Phan
(74) *Attorney, Agent, or Firm* — Young & Thompson

(57) ABSTRACT

In a method of manufacturing a semiconductor device, element properties of an element property extraction pattern formed on a semiconductor wafer is extracted as element properties of a current control element corresponding to the element property extraction pattern. A supply energy to the current control element is set which is formed between nodes on the semiconductor wafer, based on the extracted element properties. The set supply energy is supplied to the current control element to irreversible control an electrical connection between the nodes through the device breakdown by the current control element.

25 Claims, 13 Drawing Sheets

IN CASE OF WRITE

AFTER WRITE

C-C'

D-D'

METHOD OF MANUFACTURING SEMICONDUCTOR DEVICE AND SEMICONDUCTOR DEVICE

INCORPORATION BY REFERENCE

This patent application claims a priority on convention based on Japanese Patent Application No. 2009-172246 filed on Jul. 23, 2009. The disclosure thereof is incorporated herein by reference.

TECHNICAL FIELD

The present invention relates to a semiconductor device having a current control element for controlling an electric connection between nodes due to device breakage and to a manufacturing method thereof.

BACKGROUND ART

As a current control element for irreversibly controlling an electric connection between nodes due to device breakage, a fuse element and an anti-fuse element are known. The fuse element connecting nodes is broken by supplied electric energy and cuts the electric connection between nodes. Meanwhile, the anti-fuse element has an insulating film for cutting the electric connection between nodes, and when the insulating film is broken by the supplied electric energy, the nodes are electrically connected.

To adequately control the electric connection between nodes, it is required to control the energy supplied to the current control element to be an appropriate value. Especially, if the supplied energy amount is out of the appropriate value when the current control element is used for a storage section, a write error or an aged degradation defect may occur, and accordingly it is important to set the supplied energy to be the appropriate value.

FIG. 2 is a characteristic view showing a relation of the storage section using the current control element between voltage applied in data writing and a defect rate (a sum of an occurrence rate of the write defect and an occurrence rate of the aged degradation). Here, a time period of applying a write voltage is identical. Referring to FIG. 2, the appropriate applied voltage (the supplied energy) to the storage section using the fuse element will be described. When the applied voltage is a voltage V1 smaller than a predetermined value, that is, the supplied energy is small, so that an amount of Joule heat generated in the fuse element becomes small, the fuse element cannot be cut completely and the rate of the write error increases. Meanwhile, when the applied voltage is a voltage V2 larger than a predetermined value, that is, the supplied energy is large, an excessive cutting current flows through the fuse element and the Joule heat generated in the fuse element becomes larger than necessary. In this case, melted conductive material may enter an adjacent region such as a wiring region outside the fuse element from the fuse element and break an insulating film excessively. This conductive material in an excessively-broken portion forms a leaking-current path between wirings due to a heating process in a post-process after the cutting of the fuse element and the aged degradation, resulting in reconnection of the wirings. As a result, the fuse element is the same state as that of the defect of cutting, which becomes a cause of the aged degradation defect.

Meanwhile, in the case of a storage section using the anti-fuse element, when the supplied energy is small, the insulating film of the anti-fuse element is not broken completely to cause a connection defect, resulting in increase of the write error rate. In addition, when the supplied energy to the anti-fuse element is large, a thermal stress is excessively applied to the circumference of an oxide film, so that a conductive characteristic is changed. For example, a cavity may be formed in the circumferential metal wirings due to occurrence of electromigration, resulting in increase of a wiring resistance. In this case, a possibility of a connection defect (due to a write error and an aged degradation) increases.

To avoid the above defects, it is required to control the energy supplied to the current control element in accordance with characteristics of the current control element formed on a semiconductor substrate.

As a technique for controlling the energy supplied to the current control element, patent literature 1 and patent literature 2 are known. In the patent literature 1, by applying an electric pulse to an evaluation fuse provided on a semiconductor substrate, a total amount of the electric energy until the evaluation fuse is cut is evaluated, and the electric energy supplied to other fuse elements is determined on the basis of this amount. In this manner, minimum electric energy required to cut the fuse element can be supplied.

Additionally, in the patent literature 2, a semiconductor device includes a control circuit for controlling an electric stress supplied to an anti-fuse element. When detecting the breakdown of the anti-fuse element, the control circuit cuts the energy applied to the anti-fuse element after a certain period passed. In this manner, the energy can be prevented from being supplied to the anti-fuse more than necessary.

Citation List:
[patent literature 1]: JP 2006-310829A
[patent literature 2]: JP 2006-196079A

SUMMARY OF THE INVENTION

A plurality of semiconductor devices (chips) formed on a wafer are varied in a size and an electric characteristic of a device depending on the position. For example, the device size and the electric characteristic are different between a central region and an outer region in the wafer within an allowable range of the product performance. Accordingly, as shown in FIG. 1, a defect rate of a current control element to the applied voltage (the supplied energy) shows a different characteristic depending on the manufacturing variation.

In general, the state of the electric connection is controlled by supplying the same energy to the current control elements in all semiconductor devices (chips) formed on the wafer. For example, as shown in FIG. 1, a voltage VR at which an occurrence possibility of defect becomes the minimum to the manufacturing variation supposed to the semiconductor devices formed on the wafer has been set as the applied voltage (the supplied energy) to the current control element.

However, in this case, the defect rate of the semiconductor device employing the set supplied energy as an optimum value and the defect rate of other semiconductor devices show different values. Especially, in a case of a semiconductor device having a large difference in a defect rate characteristic, when the manufacturing variation occurs, deterioration of a production yield and a market defect caused by the aged degradation may occur.

In addition, the setting of the supplied energy to the current control element is carried out before the manufacturing of the semiconductor device (at a previous step to a mass-production step), and accordingly the energy cannot be an appropriate amount to the manufactured semiconductor device necessarily. For this reason, the total defect rate of the wafer may increase. In the methods of Patent literature 1 and Patent literature 2, the supplied energy to the current control element is set in accordance with the manufactured current control element. For this reason, the increase of defect rate can be suppressed. However, it is required to newly provide the evaluation fuse element in Patent literature 1, and consequently a circuit size of the semiconductor device increases. Additionally, the supplied energy to the fuse element is determined by applying a plurality of pulses until the evaluation fuse element is cut. For this reason, the time and the power consumption required to cut the fuse element increase. Also in Patent literature 2, it is required to prepare the control circuit for detecting the breakage of the anti-fuse, and accordingly the power consumption and the circuit size of the semiconductor device increases.

In an aspect of the present invention, a method of manufacturing a semiconductor device is achieved: by measuring an element characteristic of an element property extraction pattern formed on a semiconductor wafer; by extracting the element characteristic as an element characteristic of a current control element corresponding to the element property extraction pattern; by setting supply energy to the current control element which is formed between nodes on the semiconductor wafer, based on the extracted element characteristic; and by supplying the set supply energy to the current control element to irreversibly control an electrical connection between the nodes through the device breakdown by the current control element.

In another aspect of the present invention, a data writing apparatus includes: an element characteristic extracting section configured to measure an element characteristic of a element property extraction pattern formed on a semiconductor wafer, and extract the measured element characteristic as an element characteristic of a current control element related to the element property extraction pattern; a supply energy setting section configured to set energy to be supplied to the current control element which is formed between nodes on the semiconductor wafer, based on the extracted element characteristic; and a data writing section configured to write a data in a storage element by supplying the set energy to the current control element, and irreversibly controlling an electrical connection between the nodes through breakdown of the current control element.

In still another aspect of the present invention, a semiconductor device includes: a current control element formed on a semiconductor wafer and configured to control an irreversible electrical connection between nodes; and a property extraction pattern formed on the semiconductor wafer and for the device the same element properties as the current control element are set. The distance between the current control element and the property extraction pattern is within a size of a semiconductor device on which the current control element is mounted.

As described above, according to the present invention, reliability of a semiconductor device having a current control element for controlling an electric connection between nodes due to device breakage can be improved, suppressing increase of a circuit size.

In addition, supplied energy to the current control element for controlling the electric connection between nodes due to the device breakage can be set in consideration of manufacturing variation of the semiconductor device.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF EMBODIMENTS

Figure 1:
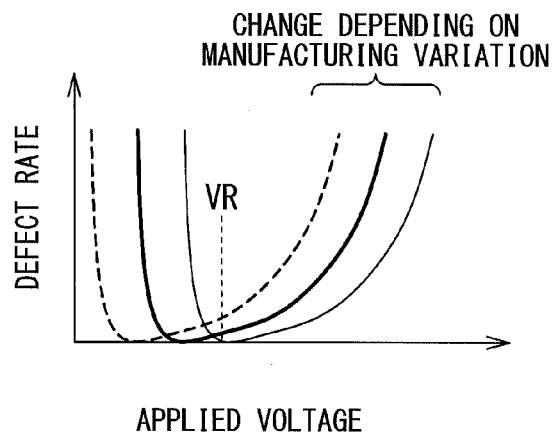
FIG. 1 is a diagram showing a relation of an applied voltage to a current control element and a defect rate.
Figure 2:
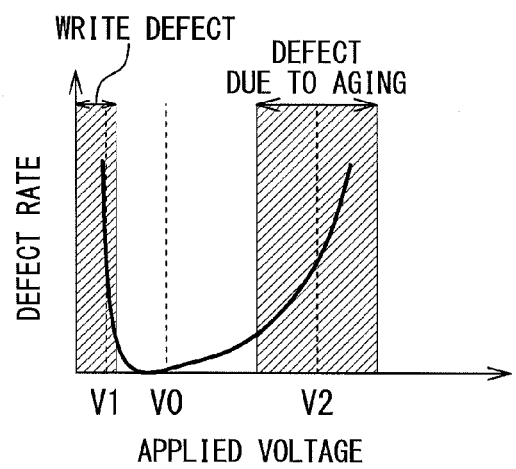
FIG. 2 is a diagram showing one example of relation between the applied voltage to the current control element and the defect rate.

Hereinafter, a semiconductor device of the present invention will be described in detail with reference to the attached diagrams. In the drawings, the same or similar reference numerals show the same or similar components. The semiconductor device has a storage section using a current control element. In addition, a data is irreversibly written into the storage section of the semiconductor device formed on a wafer.

[First Embodiment]

Referring to FIGS. 3 to 13, the semiconductor device and a manufacturing method of the semiconductor device according to a first embodiment of the present invention will be described. The semiconductor device in the present embodiment includes a storage section using an electrically melt and cut fuse element as a current control element.

Figure 3:
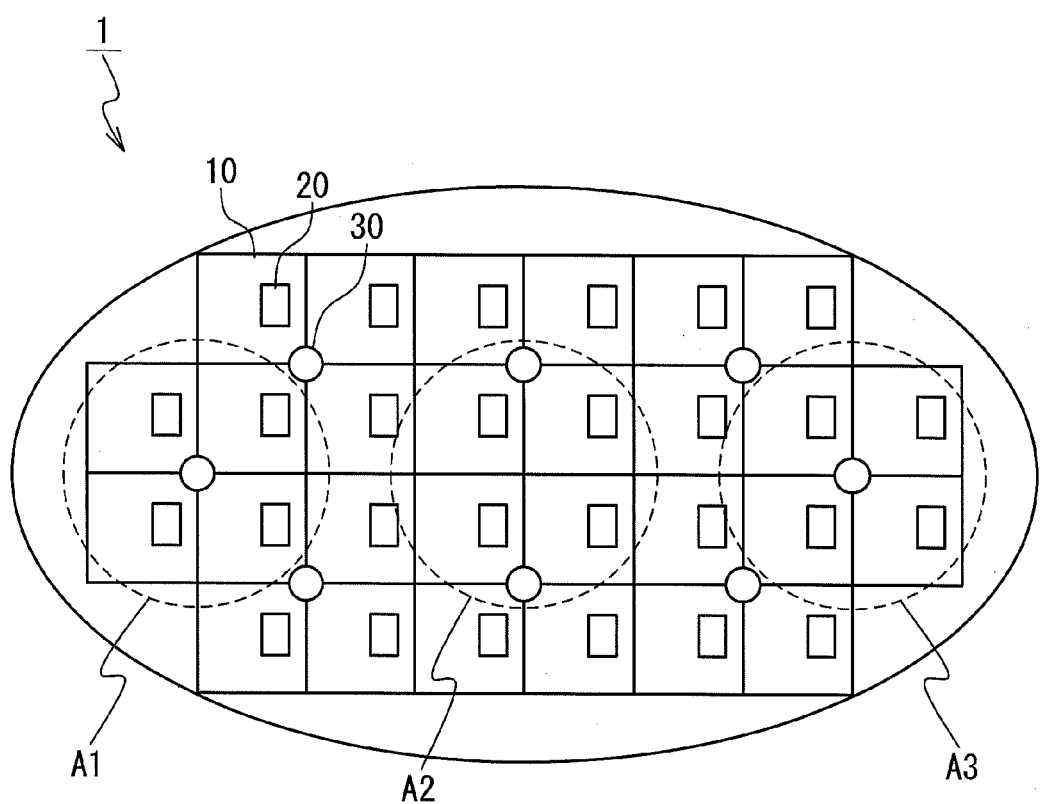
FIG. 3 is a plan view showing a structure of a semiconductor wafer according to the present invention.
Figure 4A:
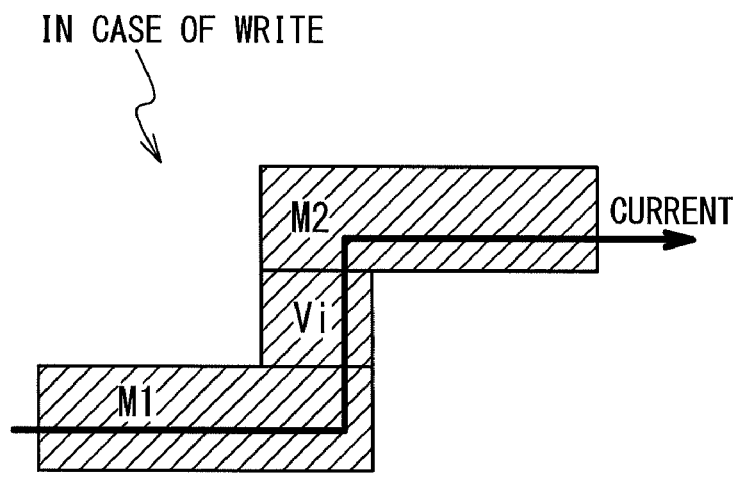
FIGS. 4A and 4B are diagrams showing a structure of a storage section using a fuse element before and after data write.
Figure 4B:
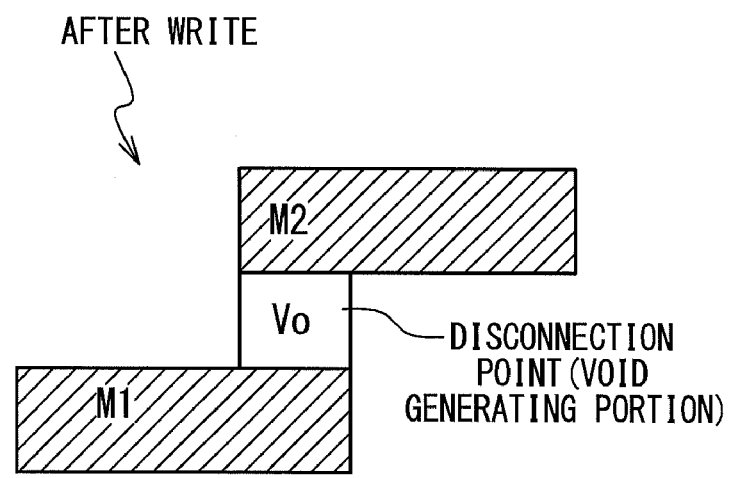

FIG. 3 is a plan view showing a structure of a semiconductor wafer 1 according to the present invention. Referring to FIG. 3, a plurality of semiconductor devices 10 are formed on the semiconductor wafer 1 in the form of chips 10. A storage section 20 using the current control element is provided on each of the plurality of the chips 10. In the present embodiment, the storage section 20 using the electrically melt and cut fuse element shown in FIGS. 4A and 4B is provided as one example. Referring to FIGS. 4A and 4B, the electrically melt and cut fuse element includes a lower-layer metal wiring M1, an upper-layer metal wiring M2, and a via-contact Vi for connecting the lower-layer metal wiring M1 and the upper-layer metal wiring M2. In the fuse element, a conductive material forming the via-contact Vi melts due to electric energy (a voltage) applied between the lower-layer metal wiring M1 and the upper-layer metal wiring M2 and flows into the upper-layer metal wiring M2 and an insulating film around the upper-layer metal wiring M2. Thus, a void Vo (a cut portion) is formed. In this manner, the fuse element is cut so as to write a data into the storage section 20.

At least one property extraction pattern 30 (a property extraction element) is formed on the wafer 1. A data writing device 100 (FIG. 10) according to the present invention obtains element properties (electric characteristics and element size) of the storage section 20 formed in a surrounding region of the property extraction pattern 30, from the property extraction pattern 30. For this reason, it is preferable that at least one property extraction pattern 30 is formed in a region where the element properties of the storage section 20 are identical to or similar to those of the property extraction pattern 30.

In the wafer 1, the electric characteristics and the element size of the chip 10 with the storage section 20 show different characteristics and value due to the manufacturing variation between the peripheral regions A1 and A3 of the wafer 1 and a central region A2. In addition, when a distance between the region A1 and the region A3 is long even in the same outer-periphery region, the element properties (the electric characteristics and the element size) in each region may be varied. In this case, it is preferable that at least one property extraction pattern 30 is formed in each of the regions A1 to A3. In a case of controlling a write voltage (the supplied energy) to the storage section 20 in detail, it is preferable to prepare one property extraction pattern 30 to one storage section 20. In this case, it is preferable that the property extraction pattern 30 is formed in the vicinity of the storage section 20. However, the element properties of the plurality of storage sections 20 may be obtained on the basis of one property extraction pattern 30. In this case, it is preferable to estimate the region where the element properties become same or similar and to form one property extraction pattern 30 in each of the regions.

Figure 5:
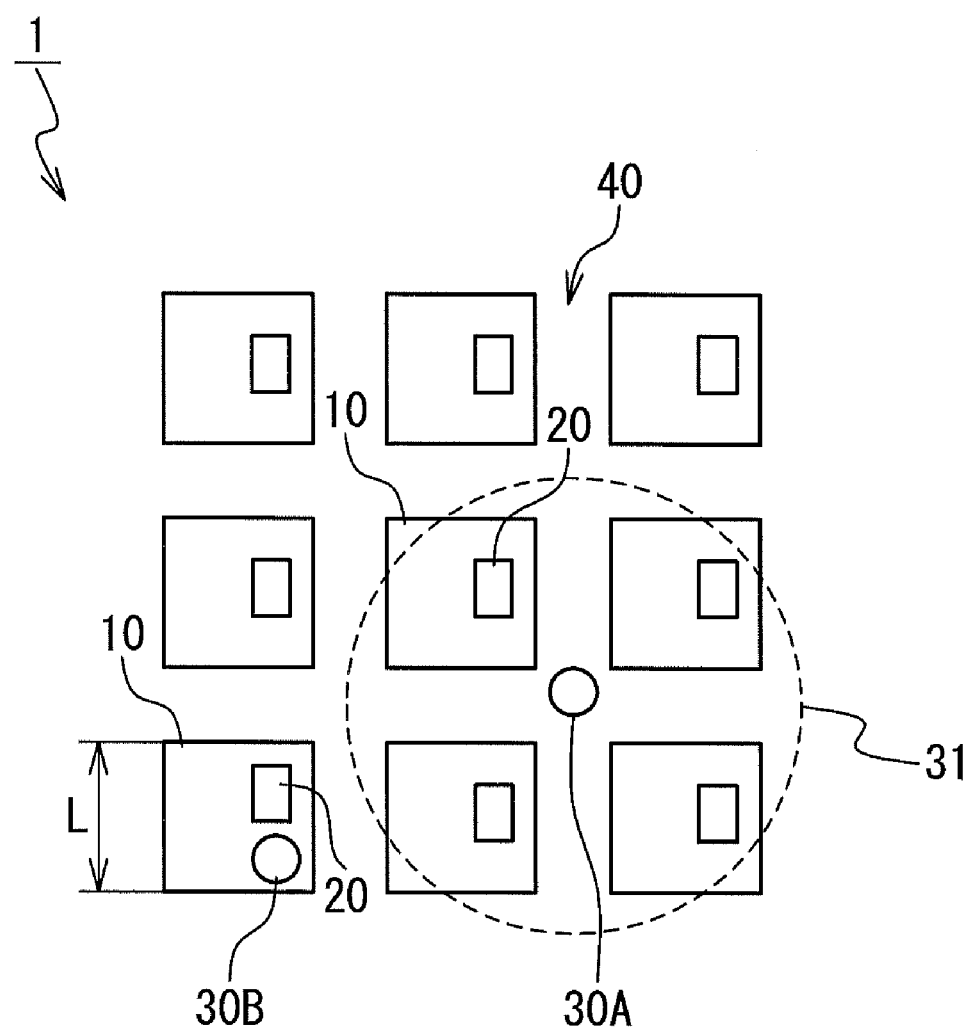
FIG. 5 is a plan view showing a formation position of a property extraction pattern according to the present invention on a wafer.

FIG. 5 is a plan view showing one example of a formation position of the property extraction pattern 30 according to the present invention on the wafer. The property extraction pattern 30 may be formed in a scribe region 40 to be diced (a property extraction pattern 30A) or in the chip 10 (a property extraction pattern 30B). When the property extraction pattern 30 is formed in the scribe region 40, the write voltage (energy supplied to cut the fuse element) to the storage section 20 can be controlled without increasing a chip area and changing a layout inside the chip 10. In this case, the property extraction pattern 30 is removed by the dicing. In addition, the property extraction pattern 30 has a layout structure described below, and can employ a property extraction pattern mounted on a common semiconductor chip. Accordingly, there is no need to add the property extraction pattern 30 dedicated only to control the write voltage (the energy supplied to the fuse element) to the storage section 20. Moreover, in the case of adding the property extraction pattern 30 to the chip 10, since a free region can be used, the chip area can be prevented from being increased.

It is preferable that the formation position of the property extraction pattern 30 is in the vicinity of the storage section 20 (including the fuse element). For example, in the case of being formed in the chip 10, like the property extraction pattern 30B, a distance from the storage section 20 is at least a chip size L (for example, 10 mm) or less. In this case, the element properties obtained by using the property extraction pattern 30B become similar to or same as the element properties of the storage section 20 inside the chip 10 forming the device itself. It is preferable that the property extraction pattern 30A in the scribe region 40 is also formed in the distance of the chip size L or less from the storage section 20. In addition, by providing the property extraction pattern 30A in an intersection region of the scribe region 40, the distances between the plurality of storage sections 20 can be approximately the same. In this manner, the element properties of the plurality of storage sections 20 in a circular region 31 around the property extraction pattern 30A can be obtained by using the property extraction pattern 30A.

Next, referring to FIGS. 6 to 9C, one example of a layout structure of the property extraction pattern 30 will be described. In the present embodiment, the element properties obtained by the data writing apparatus 100 (FIG. 10) are, for example, a wiring resistance or a via-contact resistance (for example, a layer resistance). Or, a current flowing through the wiring or the via-contact may be extracted as the element property. Accordingly, the property extraction pattern 30 in the present embodiment has a structure able to obtain the wiring resistance and the via-contact resistance.

Figure 6:
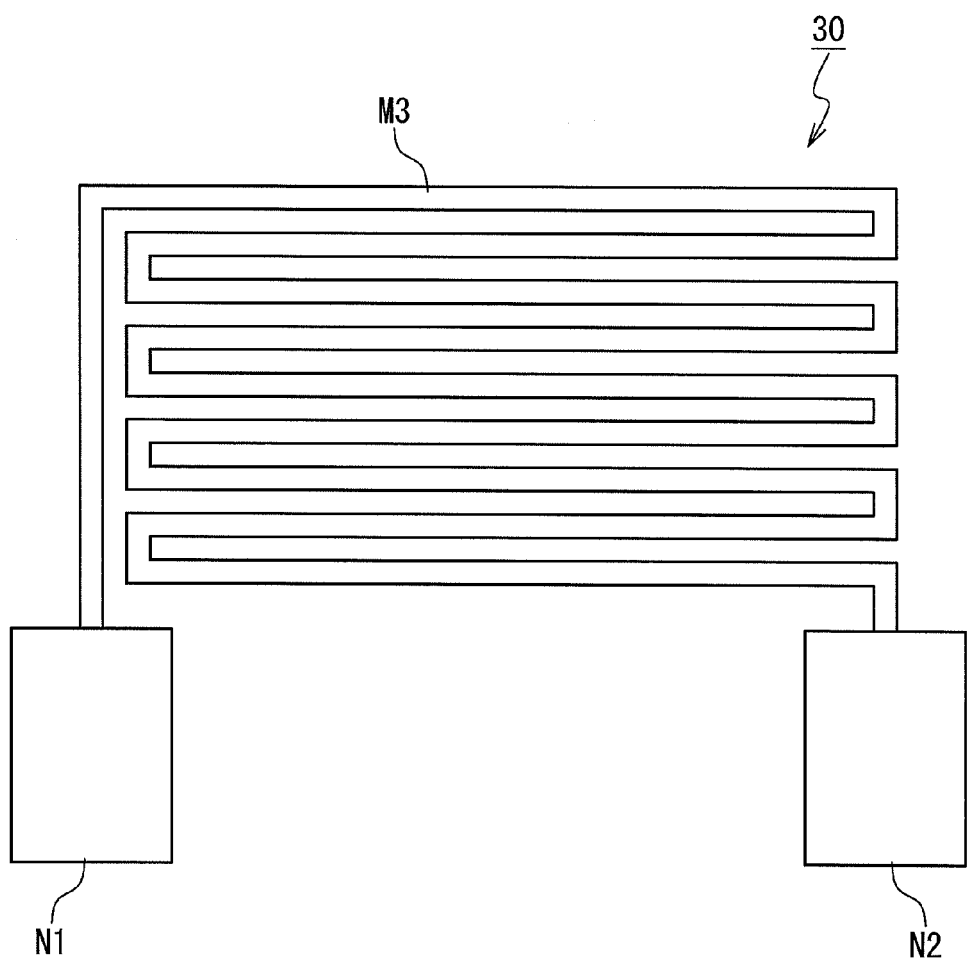
FIG. 6 is a plan view showing one example of a structure of the property extraction pattern according to the present invention.
Figure 7A:
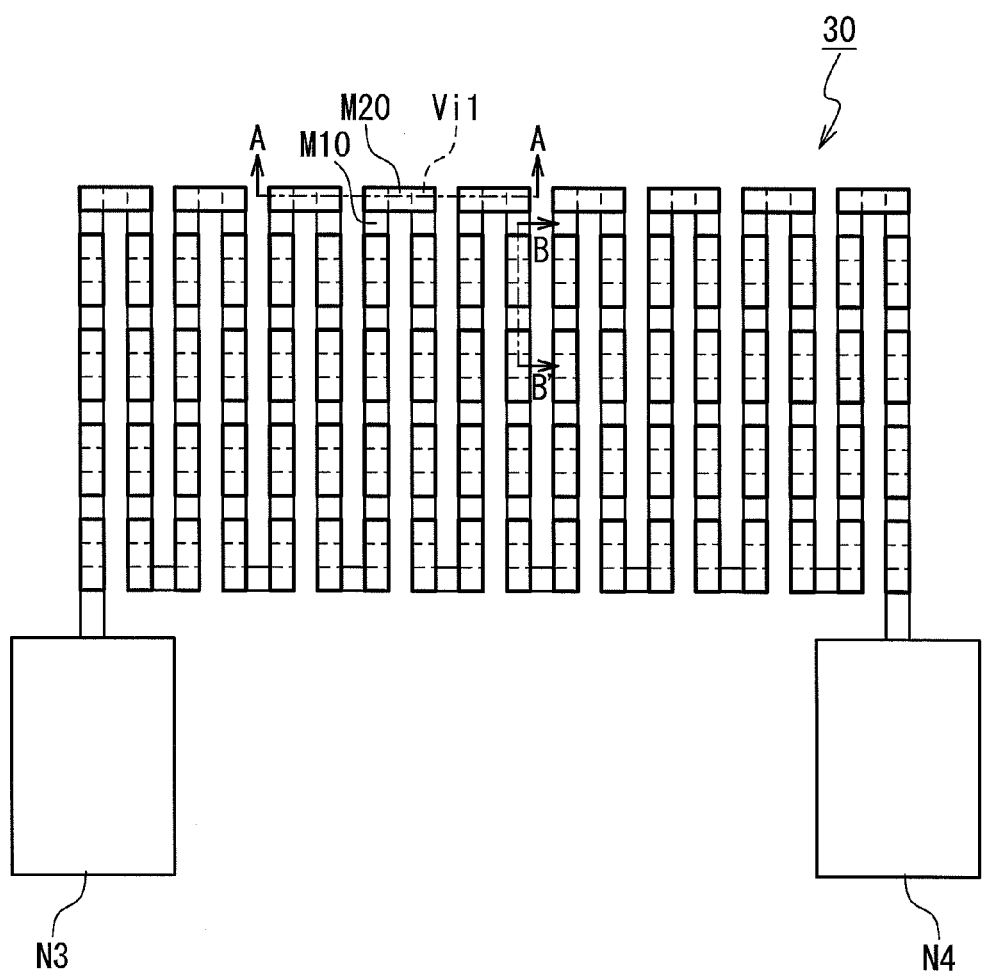
FIG. 7A is a plan view showing another example of the structure of the property extraction pattern according to the present invention.

FIGS. 6 and 7A are plan views showing the configuration of the property extraction pattern 30 for measuring the element properties (for example, the wiring resistance and a via-contact chain resistance) in a two-terminal method. The property extraction pattern 30 shown in FIG. 6 includes: two terminals N1 and N2; and a wiring M3 connected between the two terminals N1 and N2. A line width and a thickness of the wiring M3 are set to the same width and thickness of the fuse element used in the storage section 20 and having the lower-layer metal wiring M1 or the upper-layer metal wiring M2. That is, the wiring M3 is formed in a wiring size according to the process of the chip 10. In addition, the wiring M3 includes the same material as that of the lower-layer metal wiring M1 or the upper-layer metal wiring M2. The data writing apparatus 100 described below measures a resistance value of the wiring M3 through the terminals N1 and N2. In the two-terminal method, a contact resistance between a test terminal (for example, the terminals N1 and N2) and work terminals of the data writing apparatus 100 highly influence the measurement result. However, since the influence caused by the contact resistance is lowered by elongating the wiring M3, a high measurement accuracy can be obtained. Accordingly, it is preferable to increase the length of the wiring M3 by being folded more than once in the same wiring layer.

In an example shown in FIG. 6, since the element properties of the wiring M3 can be measured, the element properties of the lower-layer metal wiring M1 or the upper-layer metal wiring M2 existing in the vicinity of the property extraction pattern 30 can be estimated. Meanwhile, the property extraction pattern 30 shown in FIG. 7A is used to measure the wiring resistance and the via-contact resistance.

Figure 7B:
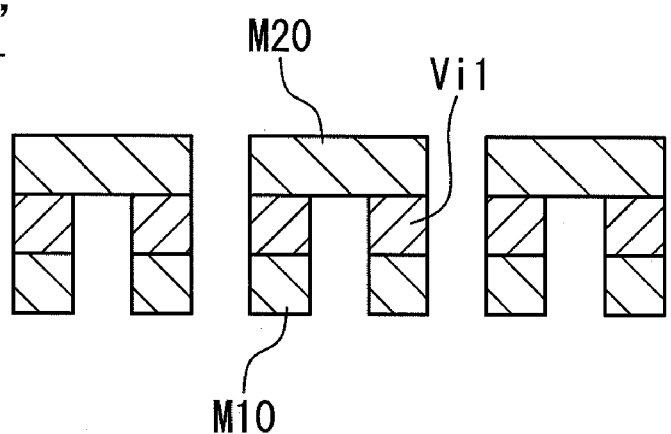
FIG. 7B is an cross sectional view of the pattern along the line A-A' in FIG. 7A.
Figure 7C:
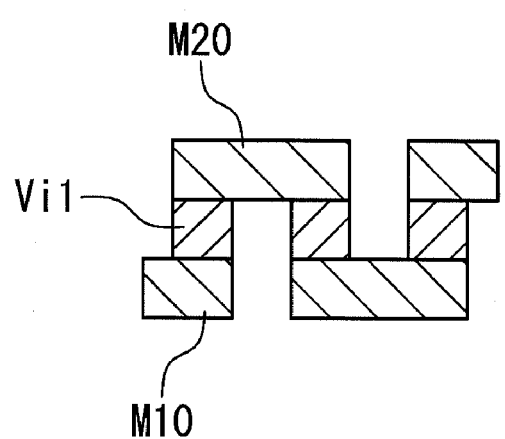
FIG. 7C is a cross sectional view of the pattern along the line B-B' in FIG. 7A.

The property extraction pattern 30 shown in FIG. 7A includes: two terminals N3 and N4; and a via-contact chain connected between two terminals N3 and N4. As shown in FIGS. 7A, 7B, and 7C, the via-contact chain includes a plurality of chain structures where a lower-layer wiring M10, a via-contact Vi1, and an upper-layer wiring M20 are connected in that order. Here, FIG. 7B is a cross-sectional view of the pattern along the line A-A' shown in FIG. 7A, and FIG. 7C is a cross-sectional view of the pattern along the line B-B' shown in FIG. 7A.

The line width and thickness of each of the lower-layer wiring M10 and the upper-layer wiring M20 are set to the same width and thickness of the lower-layer metal wiring M1 and the upper-layer metal wiring M2. In addition, the size of the via-contact Vi1 is set to the same size as that of the via-contact Vi used in the storage section 20 (equivalent to the fuse element). That is, the lower-layer wiring M10, the upper-layer wiring M20, and the via-contact Vi1 are formed in the wiring size and the via-contact size determined in accordance with the process of the chip 10. In addition, preferably, the lower-layer wiring M10, the upper-layer wiring M20, and the via-contact Vi1 include the same materials as those of the lower-layer metal wiring M1, the upper-layer metal wiring M2, and the via-contact Vi, respectively. The data writing apparatus 100 measures resistance values of the lower-layer wiring M10 and the upper-layer wiring M20, including the via-contact Vi1 by a current flowing through a path of the lower-layer wiring M10, the via-contact Vi1, and the upper-layer wiring M20 via the terminals N3 and N4. In the same manner as the above-described manner, it is preferable to lower the influence of the contact resistance between test terminals (the terminals N3 and N4) and work terminals and to obtain high measurement accuracy. Accordingly, it is preferable to increase the lengths of the lower-layer wiring M10 and the upper-layer wiring M20 by being folded more than once on the same wiring layer and to provide the plurality of the via-contacts Vi1 in a predetermined interval.

In one example shown in FIG. 7A, since the element properties of the whole of pattern including the lower-layer wiring M10, the upper-layer wiring M20, and the via-contacts Vi1 can be measured, the element properties of the via-contact Vi existing in the vicinity of the property extraction pattern 30 can be estimated by considering the properties extracted in the example shown in FIG. 6 of the lower-layer metal wiring M1 and the upper-layer metal wiring M2.

Figure 8:
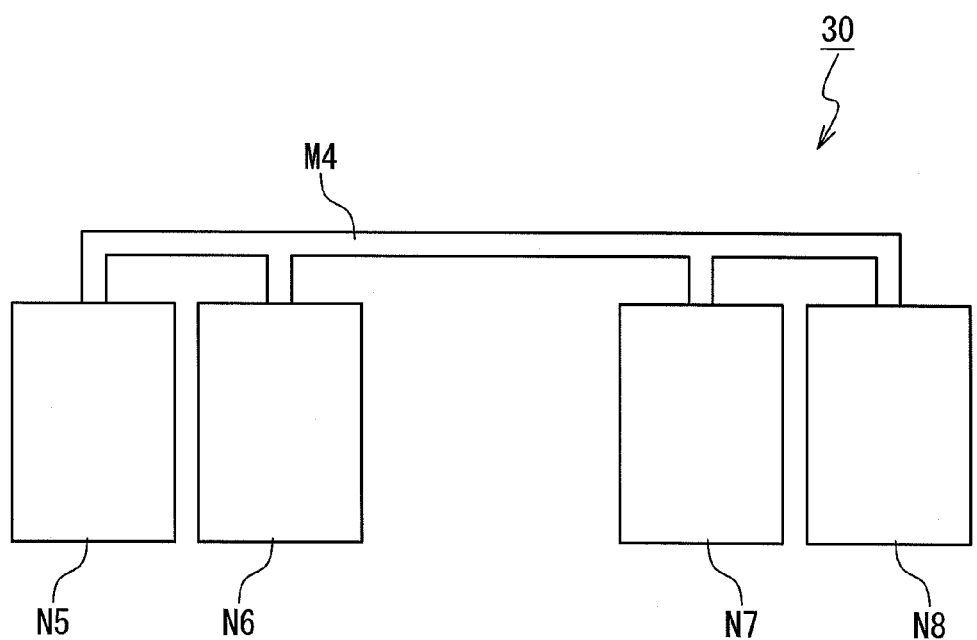
FIG. 8 is a plan view showing further another example of the structure of the property extraction pattern according to the present invention.
Figure 9A:
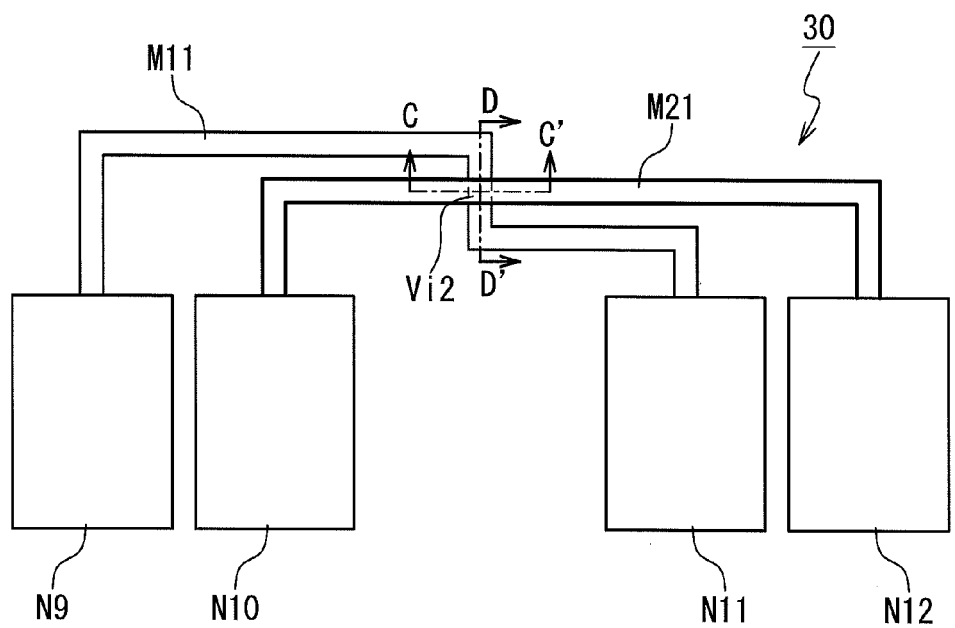
FIG. 9A is a plan view showing further another example of the structure of the property extraction pattern according to the present invention.

FIGS. 8 and 9A are plan views showing the configuration of the property extraction pattern 30 for measuring the element properties (for example, the wiring resistance and a parasitic capacitance) in a four-terminal method. The property extraction pattern 30 shown in FIG. 8 includes: four terminals N5 to N8; and a wiring M4 connected to the four terminals N5 to N8. A line width and a thickness of the wiring M4 are set to the same width and thickness of the fuse element used in the storage section 20 and having the lower-layer metal wiring M1 or the upper-layer metal wiring M2. That is, the wiring M4 is formed in a wiring size according to the process of the chip 10. In addition, the wiring M4 includes the same material as that of the lower-layer metal wiring M1 or the upper-layer metal wiring M2. The data writing apparatus 100 described below measures a current flowing through the wiring M4 by use of the terminals N5 and N8, and measures a voltage between the terminals N6 and N7. In this manner, the resistance value and the parasitic capacitance of the wiring M4 are measured. To facilitate the measurement of the wiring resistance, it is preferable to increase the length of the wiring M4 (lengths between the terminals N5 and N6 and the terminals N7 and N8) by being folded more than once on the same wiring layer.

In one example shown in FIG. 8, since the element properties of the wiring M4 can be measured, the element properties of the upper-layer metal wiring M2 and the lower-layer metal wiring M1 existing in the vicinity of the property extraction pattern 30 can be estimated. Meanwhile, the property extraction pattern 30 shown in FIG. 9A is used for measuring the wiring resistance and the via-contact resistance.

Figure 9B:
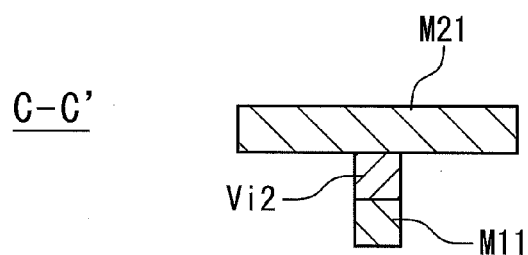
FIG. 9B is a cross sectional view of the pattern along the line C-C' in FIG. 9A.
Figure 9C:
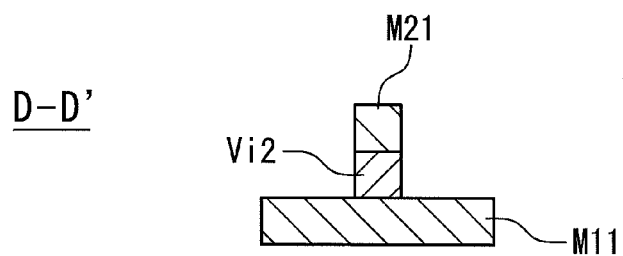
FIG. 9C is a cross sectional view of the pattern along the line D-D' in FIG. 9A.

The property extraction pattern 30 shown in FIG. 9A includes four terminals N9 to N12, a lower-layer wiring M11 connected between the terminal N9 and the terminal N11, an upper-layer wiring M21 connected between the terminal N10 and the terminal N12, and a via-contact Vi2 connecting the lower-layer wiring M11 and the upper-layer wiring M21. Here, FIG. 9B is a cross-sectional view of the pattern along the line C-C' shown in FIG. 9A. FIG. 9C is a cross-sectional view of the pattern along the line D-D' shown in FIG. 9A. Referring to FIGS. 9B and 9C, the via-contact Vi2 is provided in an intersection region between the lower-layer wiring M11 and the upper-layer wiring M21, and electrically connects them.

The line width and thickness of each of the lower-layer wiring M11 and the upper-layer wiring M21, for example, are set to the same width and thickness of the lower-layer metal wiring M1 and the upper-layer metal wiring M2. In addition, a size of the via-contact Vi2 is set to the same size as that of the via-contact Vi used in the storage section 20 (equivalent to the fuse element). That is, the lower-layer wiring M11, the upper-layer wiring M21, and the via-contact Vi2 are formed in the wiring size and the via-contact size according to the process of the chip 10. In addition, preferably, the lower-layer wiring M11, the upper-layer wiring M21, and the via-contact Vi2 include the same materials as those of the lower-layer metal wiring M1, the upper-layer metal wiring M2, and the via-contact Vi, respectively. The data writing apparatus 100 described below measures current flowing through the wiring and the via-contact by use of the terminals N9 and N10, and measures a voltage between the terminals N11 and N12. In this manner, the resistance value of the via-contact Vi2 can be measured.

In one example shown in FIG. 9A, since the element properties of the via-contact Vi2 can be measured, the element properties of the via-contact Vi existing in the vicinity of the property extraction pattern 30 can be estimated.

Using the four-terminal method, the element properties of the wiring resistance and the like can be measured with better accuracy than that of the two-terminal method. Meanwhile, in the case of using the two-terminal method, since the element properties can be easily measured and the number of the terminals for measuring the element properties can be reduced in comparison with the four-terminal method, the area of the semiconductor device (that is, a cost of the semiconductor device) can be reduced.

In the present embodiment, data can be irreversibly written by cutting the fuse element of the semiconductor device 10 on the wafer 1. The data writing apparatus 100 for writing a data into the storage section 20 in a manufacturing step of the semiconductor device 10 will be described below.

Figure 10:
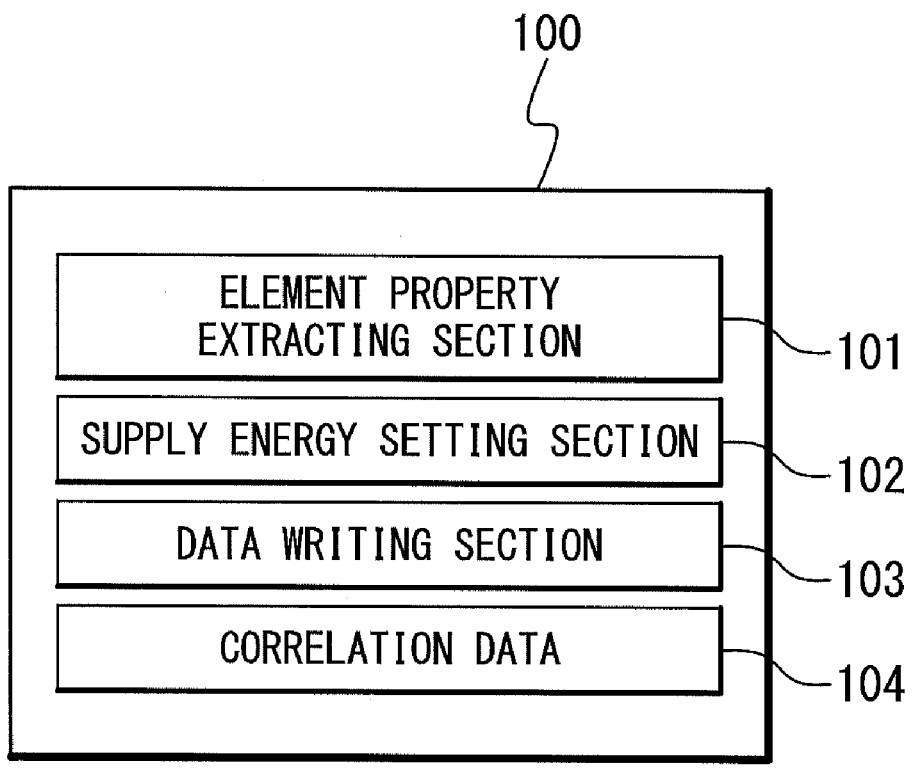
FIG. 10 is a diagram showing one example of a configuration of a data writing apparatus according to the present invention.

FIG. 10 is a diagram showing one example of the configuration of the data writing apparatus 100 according to the present invention. Referring to FIG. 10, the data writing apparatus 100 according to the present invention includes an element property extracting section 101, a supply energy setting section 102, and a data writing section 103. When a program stored in a memory section (not shown), into which the program is loaded from a recording medium, is executed by a CPU, the element property extracting section 101, the supply energy setting section 102, and the data writing section 103 can be realized. Or, the element property extracting section 101, the supplied energy setting section 102, and the data writing section 103 may be realized in hardware and may be realized by a combination of the hardware and the software. In addition, the data writing apparatus 100 includes correlation data 104 that is stored in the memory section (not shown) in advance.

The element properties extracting section 101 according to the first embodiment measures the element properties of the wiring resistance, the via-contact resistance, and the like by using the property extraction pattern 30, and estimates the element properties of the storage section 20 on the basis of the measurement result. Here, it is preferable that the property extraction pattern 30 as a measurement target and the storage section 20 as an estimation target of the element properties are related to each other in advance. It is preferable that the storage section 20 to be related to the property extraction pattern 30 is in the vicinity of the property extraction pattern 30. Details of a positional relation of the both have been described above. The element property extracting section 101 extracts the element properties of the storage section 20 related to the property extraction pattern 30 from the measured result. Or, after correcting the measured result by using a predetermined algorithm or parameter, the corrected properties may be extracted as the element properties of the storage section 20. It is preferable that the algorithm and the parameter used for the correction of the element properties are set in accordance with the distance between the storage section 20 and the property extraction pattern 30.

The supply energy setting section 102 sets the supply energy used to write a data into the storage section 20 (to cut the fuse element), by using the element properties extracted by the element property extracting section 101 and the correlation data 104.

Here, details of the correlation data 104 according to the present embodiment will be described. The correlation data 104 is a data showing a correspondence relation between the element properties of the storage section 20 (the fuse element) and the supply energy to write data into the storage section 20 (to cut the fuse element). For example, the correlation data 104 shows the relation between the product (the element properties) of the resistances of the upper-layer metal wiring M2 and the via-contact Vi in the storage section 20 and a minimum value of the supply energy (supply voltage) required for writing a data into the storage section 20.

Figure 11:
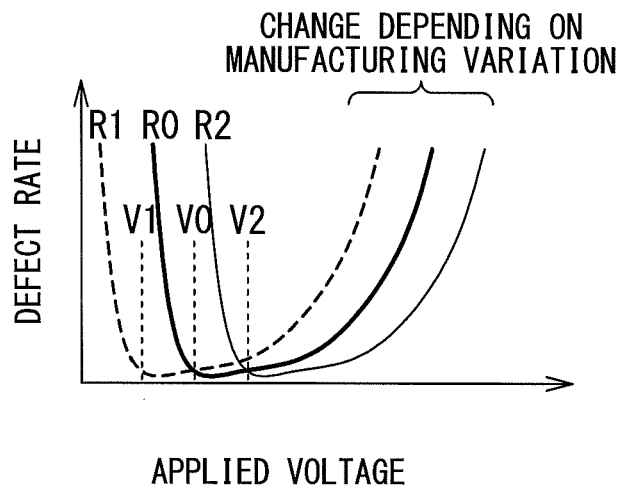
FIG. 11 is a diagram showing a variation of relation between the applied voltage to the current control element and a defect rate in the present invention.
Figure 12:
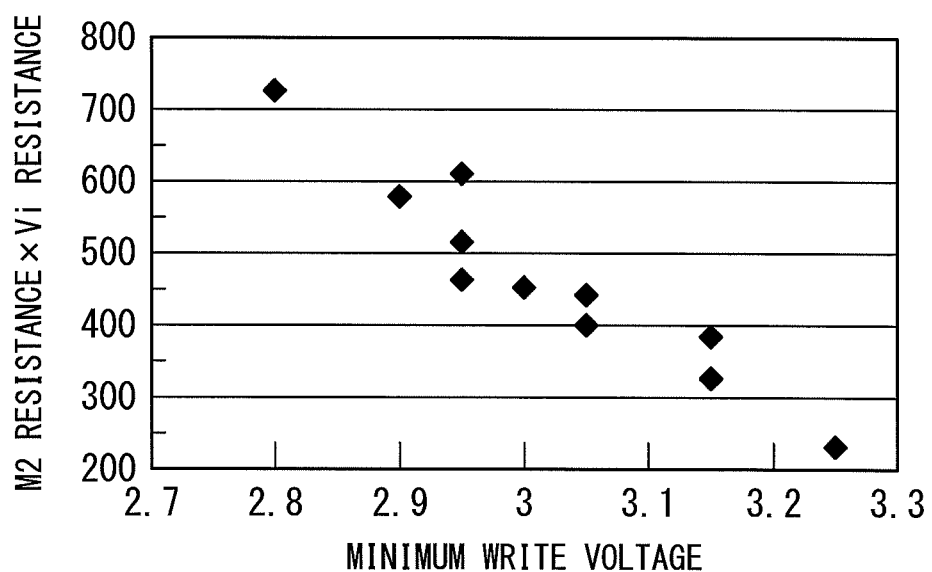
FIG. 12 is a diagram showing one example of relation between a resistance component included in the current control element (a fuse element) and a lowest write voltage.

Referring to FIG. 11, a defect rate characteristic of the storage section 20 formed in each of the regions A1, A2, and A3 shown in FIG. 3 shows a different characteristic depending on the manufacturing variation in each region. Here, when the products of the wiring resistance of the upper-layer metal wiring layer M2 and the via-contact Vi resistance in the storage section 20 in the regions A1, A2, and A3 are R0, R1, and R2, respectively, the minimum values of the supply voltage required for data writing are based on the resistance products R0, R1, and R2. That is, the relation between the product of the wiring resistance of the upper-layer metal wiring layer M2 and the via-contact Vi resistance and the minimum supply voltage is as shown in FIG. 12. By using this relation as the correlation data 104, the minimum supply voltage related to the extracted wiring resistance and via-contact resistance can be obtained.

Here, as one example of the correlation data 104, the relation between the product of the wiring resistance and the via-contact resistance and the minimum supply voltage is shown. However, the relation between another parameter (the element properties) and the supply energy may be used as the correlation data 104. The respective current values of the lower-layer metal wiring M1, the upper-layer metal wiring M2, and the via-contacts Vi in the fuse element are exemplified as the element properties, and a supply voltage, a supply current, a supply time of voltage or current, the number of pulses, and the like are exemplified as the supply energy.

It is preferred that the supply energy setting section 102 obtains the minimum voltage for writing a data by using the extracted element properties and correlation data 104 and sets the optimum supply voltages V0, V1, and V2 (the optimum supply energies) by adding predetermined voltage values to the minimum voltage. When the supply voltage is lower than the minimum voltage for writing data, the defect rate rapidly increases. For this reason, in consideration of the property variation caused by the manufacturing variation, it is preferable that the optimum supply voltage is set to be higher than the minimum voltage. In this case, when the supply voltage is too high, data destruction caused by the aged degradation may occur, and accordingly it is preferable to set the supply voltage, considering the aged degradation. For example, to consider the aged degradation of the case of supply a high voltage, it is preferable that the correlation between the element properties (for example, resistance product) and a maximum voltage in consideration of the aged degradation is included in the correlation data 104. In this case, when the resistance products R0, R1, and R2 are extracted by the element property extracting section 101, the optimum supply voltages V0, V1, and V2 (the optimum supply energy) are set after subtracting a predetermined voltage from the maximum voltages according to the respective resistance products. Or, the correlation between the minimum supply voltage for writing a data and the maximum voltage in consideration of the aged degradation, and the element properties may be prepared as the correlation data 104. In this case, voltages that are higher than the minimum supply voltage related to the extracted element properties by a predetermined value and are lower than the voltage in consideration of the aged degradation are set as the optimum supply voltages V0, V1, and V2. In this case, the minimum supply voltage and the maximum supply voltage related to the extracted element properties may be outputted to an output unit (not shown) as a settable voltage range in a visible manner. Thus, the supply voltage to the fuse element may be selected within the settable voltage range by the user through an input unit (not shown). Moreover, as the correlation data 104, not only the correlation between the resistance product and the supply voltage, but also a correlation between any one of the resistances of the lower-layer metal wiring M1, the upper-layer metal wiring M2, the via-contact Vi, or the like including the fuse element and the supply voltage (the supply energy) may be employed.

The data writing section 103 supplies the optimum supply energy set by the supply energy setting section 102 to the storage section 20. In this manner, the fuse element of the storage section 20 is cut, and the data is written. The data writing section 103 supplies the optimum supply voltage obtained on the basis of the element properties to the storage section 20 in the vicinity of the property extraction pattern 30 as the extraction target of the element properties.

As described above, the data writing apparatus 100 according to the present invention determines a data-write voltage to the storage section 20 in the vicinity to the property extraction pattern 30 on the basis of the element properties obtained from the property extraction pattern 30. For this reason, the optimum supply voltage according to the manufacturing variation can be applied, and the number of the storage section 20 (the fuse elements) causing the write error (the cutting error) can be reduced. Meanwhile, the number of the storage sections 20 (the fuse elements) causing the errors due to the aged degradation can be reduced. In this manner, the reliability of the semiconductor device is improved and a production yield is improved. The manufacturing variation described here includes manufacturing variation depending on the position in the wafer 1, and manufacturing variation of the respective wafers 1 whose manufacturing dates and manufacturing apparatuses are different.

Figure 13:
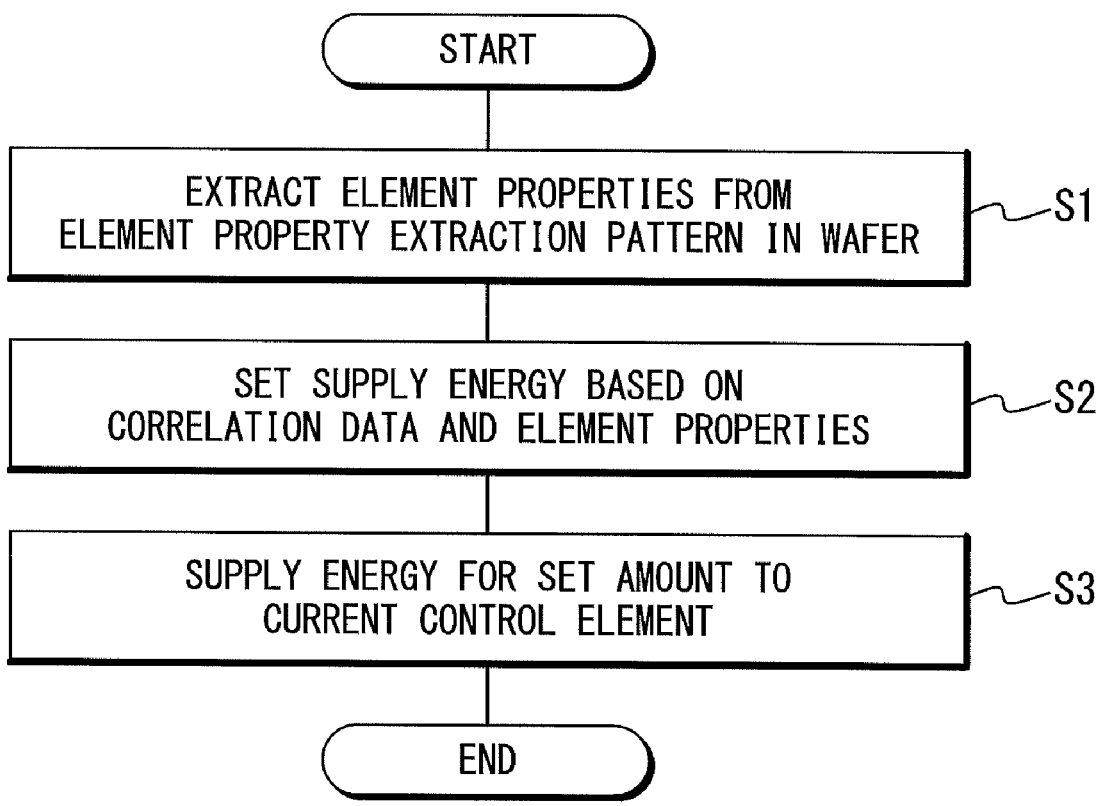
FIG. 13 is a flowchart showing one example of a data writing operation in the present invention.

Next, referring to FIG. 13, details of the data writing method (the fuse cutting method) according to the present invention will be described. At first, the element properties of the storage section 20 is extracted from the element property extraction pattern 30 formed on the wafer 1 (step S1). Specifically, the measurement terminals of the data writing apparatus 100 are connected to the terminals of the element property extraction pattern 30, and the element properties of the element property extraction pattern 30 are measured by a current measurement, a voltage measurement, and the like. Here, as the electric characteristics, the wiring resistance and the via-contact resistance of the element property extraction pattern 30 are measured. The measured electric characteristics are extracted as the element properties of the storage section 20 related to the element property extraction pattern 30. The element properties may be recorded to the memory section (not shown). The extraction of the element properties may be simultaneously carried out to the whole of the storage sections 20 formed on the wafer 1, and after dividing the plurality of storage sections 20 formed on the wafer 1 into a plurality of groups, may be carried out to each group. In addition, the extraction of the element properties may be carried out only to the storage section 20 as a writing target of data.

The data writing apparatus 100 sets the supply energy used to write a data into the storage section 20 by using the extracted element properties of the storage section 20 and the correlation data 104 (step S2). In the present embodiment, the supply voltage and an application time for cutting the fuse element in the storage section 20 are set. The data writing apparatus 100 supplies the set supply energy to a current control element (step S3). Here, the set supply voltage is supplied to the fuse element during the set application time, and thus data is written into the storage section 20.

The optimum supply voltage is supplied to the storage section 20 based on the element properties of the element property extraction pattern 30 near the section 20. For this reason, a write error of data to the storage section 20 can be reduced. According to the present invention, since the supply voltage (the cutting voltage) can be controlled based on the manufacturing variation for each storage section 20 or each wafer 1, the defect rate due to the manufacturing variation can be prevented from increasing. In addition, since the minimum supply voltage required to cut the fuse element and the voltage such that the defect rate due to the aged degradation is not increased are set as the supply voltage (the write voltage), the reliability of the semiconductor device can be improved.

[Second Embodiment]

In the first embodiment, the fuse element is used as the storage section 20. However, the anti-fuse element may also be used. The storage section 20 according to a second embodiment employs the anti-fuse (an example: an anti-fuse element of a MOS (Metal Oxide Semiconductor) structure) for electrically connecting nodes by being broken in accordance with a predetermined supply energy. In this case, the correlation data 104 stored in advance by the data writing apparatus 100 indicates a relation between a film thickness and a defect rate of an insulating film of the anti-fuse, or a relation between the film thickness and the optimum supply voltage. In addition, a MOS transistor having a similar configuration to the anti-fuse is formed as the property extraction pattern 30 (the property extraction element) on the wafer 1.

A structure of the wafer 1 according to the second embodiment is the same as that of the first embodiment, except that the anti-fuse element is used as the storage section 20 and that the property extraction pattern 30 has the same configuration as that of the anti-fuse element. Accordingly, description thereof will be omitted.

The data writing apparatus 100 according to the second embodiment will be described below. Here, different portions from the data writing apparatus 100 according to the first embodiment will be described.

The element property extracting section 101 according to the second embodiment measures the film thickness of a gate oxide film and the element properties such as a threshold voltage and a drain current of the MOS transistor by using the property extraction pattern 30, and estimates the element properties of the storage section 20 on the basis of the measurement result.

The supply energy setting section 102 sets the supply energy used to write a data into the storage section 20 (to make the anti-fuse element be conductive) by using the element properties extracted by the element property extracting section 101 and the correlation data 104.

Here, details of the correlation data 104 according to the present embodiment will be described. The correlation data 104 shows a correspondence relation between the element properties of the storage section 20 (the anti-fuse element) and the supply energy used to write the data into the storage section (to make the anti-fuse element be conductive). For example, the correlation between the film thickness of the insulating film (the gate oxide film) of the storage section 20 and the minimum value of the supply energy required to write the data into the storage section 20 is recorded as the correlation data 104.

Figure 14:
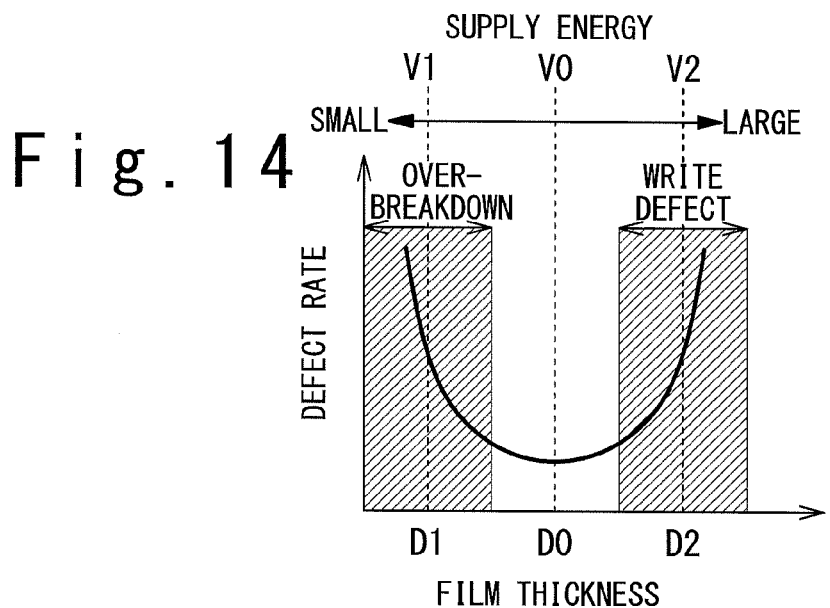
FIG. 14 is a diagram showing one example of relation between a film thickness of an insulating film and a defect rate in the current control element (an anti-fuse element)

FIG. 14 is a diagram showing one example of the relation between the film thickness of the insulating film (the gate oxide film) and the defect rate in the current control element (the anti-fuse element) in a case of applying the voltage V0. When the film thickness of the insulating film is thinner than a predetermined thickness (for example, a film thickness D1), the anti-fuse element is excessively broken, and thereby the error rate of data write and the defect rate according to the aged degradation increase. On the other hand, when the film thickness is thicker than the predetermined thickness (for example, a film thickness D2), the write error rate increases since a probability that the insulating film is not broken increases. Accordingly, to reduce the defect rate to be closer to a minimum value, it is required to set the appropriate film thickness (for example, a film thickness D0) corresponding to the write voltage.

When the optimum supply energy to the storage section 20 of the film thickness D0 is the voltage V0, the optimum supply energy to the storage section 20 of the film thickness D1 thinner than the film thickness D0 is the voltage V1 smaller than the voltage V0, and the optimum supply energy to the storage section 20 of the film thickness D2 thicker than the film thickness D0 is the voltage V2 larger than the voltage V0. That is, the relation between the supply voltage to the storage section 20 of the film thickness D0 and the defect rate is shown as in FIG. 15.

Figure 16:
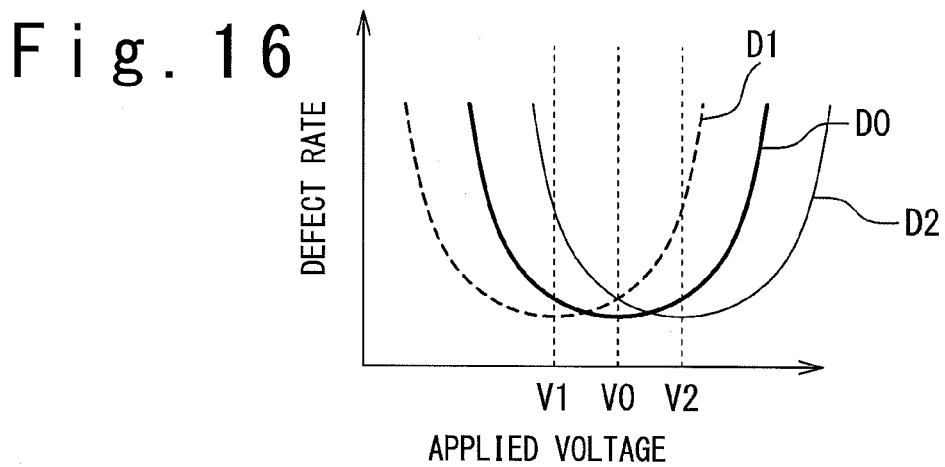
FIG. 16 is a diagram showing another example of the relation between the applied voltage to the current control element and the defect rate in the present invention.

Referring to FIG. 16, the storage section 20 of other film thicknesses also has a same characteristic of defect rate, and an optimum supply voltage also shows a different value. For this reason, in the present embodiment, it is preferred that the correlation between the film thickness of the gate oxide film of the storage section 20 (the anti-fuse element) and the optimum supply voltage is recorded as the correlation data 104.

Here, the correlation between the film thickness of the insulating film and the optimum supply voltage has been shown as one example of the correlation data 104. However, the correlation between another parameter (the element properties) and the supply energy may be used as the correlation data 104. For example, the drain current, the threshold voltage, and the like of the anti-fuse element are employed as the element properties, and the supply voltage, the supply current, the supply time of voltage or current, the number of pulses, or the like are employed as the supply energy.

Figure 15:
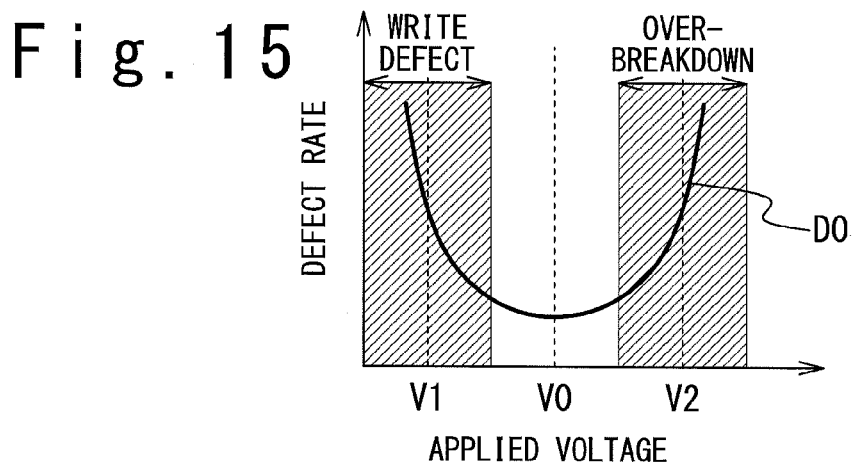
FIG. 15 is a diagram showing another example of relation between the applied voltage to the current control element and the defect rate.

It is preferred that the supply energy setting section 102 obtains the minimum supply voltage required to write a data by using the extracted element properties and the correlation data 104, and sets the optimum supply voltage (the optimum supply energy) by adding a predetermined voltage value to the minimum supply voltage. Referring to FIG. 15, when the supply voltage is lower than the minimum supply voltage required to write the data, the defect rate rapidly increases due to the writing defect. For this reason, in consideration of a property variation caused by the manufacturing variation, it is preferable that the optimum supply voltage is set to be higher than the minimum supply voltage. In this case, when the supply voltage is too high, data destruction caused by the excessive breakage may occur. Accordingly, it is preferable to set the supply voltage in consideration of the excessive breakage. For example, when the film thicknesses D0, D1, and D2 are extracted by the element property extracting section, voltages that are higher than the minimum supply voltages by a predetermined voltage based on the respective film thicknesses and lower than the voltages in consideration of the excessive breakage are set as the optimum supply voltages V0, V1, and V2. In this manner, to consider the excessive breakage of the case of applying the high voltage, it is preferable that the correlation between the element properties and the maximum supply voltage in consideration of the excessive breakage is included in the correlation data 104. Or, the relation between the film thickness and the optimum supply voltage may be retained as the correlation data 104 as described above, and thereby the optimum supply voltage corresponding to the film thickness may be directly set.

The data writing section 103 supplies the optimum supply energy set by the supply energy setting section 102 to the storage section 20 as a data-write target. The anti-fuse element of the storage section 20 is connected in this manner, and thus a data is written. The data writing section 103 supplies the optimum supply voltage obtained on the basis of the element properties to the storage section 20 near the property extraction pattern 30 as the extraction target of the element properties.

As described above, the data writing apparatus 100 according to the present invention determines the data-write voltage to the storage section 20 in the vicinity to the property extraction pattern 30 on the basis of the element properties obtained from the property extraction pattern 30. For this reason, the optimum write supply voltage can be applied based on the manufacturing variation, and the number of the storage sections 20 (the anti-fuse elements) causing the write error (the cutting error) can be reduced. In this manner, the reliability of the semiconductor device can be improved and a production yield can be improved. The manufacture variation described here includes a manufacturing variation depending on the position in the wafer 1, and a manufacturing variation for every wafer 1 for every manufacturing date and for every manufacturing apparatus.

Next, referring to FIG. 13, the data writing method (an anti-fuse connecting method) according to the present embodiment will be described. Here, the explanation of the same operations as those of the first embodiment is omitted, and only different operations will be described. At first, the element properties of the storage section 20 are extracted from the element property extraction pattern 30 formed on the wafer 1 (step S1). In the extraction of the element properties, the drain current flowing through the MOS transistor type property extraction pattern 30 is measured, and the element properties (the film thickness) of the storage section 20 (the anti-fuse element) are extracted on the basis of the correlation between the drain current (not shown) and the film thickness of the gate oxide film.

The data writing apparatus 100 sets the supply energy used to write a data into the storage section 20 by using the extracted element properties of the storage section 20 and the correlation data 104 (step S2). In the present embodiment, the supply voltage to establish the connection of the anti-fuse elements in the storage section 20 is set. The data writing apparatus 100 supplies the set supply energy to the current control element (step S3). Here, the set supply voltage is supplied to the anti-fuse element, and thus the data is written into the storage section 20.

The optimum supply voltage is supplied to the storage section 20 based on the element properties by the element property extraction pattern 30 near the storage section 20. For this reason, a write error of the data to the storage section 20 can be reduced. According to the present invention, since the supply voltage according to the manufacturing variation can be applied to each storage section 20 or each wafer 1, the defect rate due to the manufacturing variation can be prevented from increasing. In addition, since the minimum supply voltage value required to cut the anti-fuse element and the supply voltage at which the defect rate due to the excessive breakage and the aged degradation is not increased are set as the write supply voltage, the reliability of the semiconductor device can be improved.

The embodiment of the present invention has been described above in detail. However, the specific configuration is not limited to the above-described embodiments, and any modification within the scope of the present invention is also included in the present invention. In the first and second embodiments, the storage section using the current control element has been described. However, not limited to this, the present invention can be applied to the semiconductor device and the semiconductor wafer having the current control element for irreversibly controlling the connection between the nodes. In this case, the data writing apparatus 100 serves as a device for setting and supplying the supply energy to control the electric connection in the current control element (e.g. the fuse cutting element and the anti-fuse connecting element).

In addition, it is preferable that although the data writing apparatus 100 is provided outside the wafer 1, a part of the function of the data writing apparatus 100 (portions relating to hardware of the element property extracting section 101, the supply energy setting section 102, and the data writing section 103) may be formed on the wafer 1. Moreover, it is preferable that the data writing apparatus 100 is provided to a semiconductor tester for inspecting the characteristics of the semiconductor device 10 formed on the wafer 1.

What is claimed is:

1. A method of manufacturing a semiconductor device, comprising:
extracting element properties of an element property extraction pattern formed on a semiconductor wafer as element properties of a current control element which is formed between nodes on said semiconductor wafer;
setting a supply energy to be supplied to said current control element in write of a data into said current control element, based on the extracted element properties; and
supplying the set supply energy to said current control element to irreversibly control an electrical connection between the nodes.

2. The method according to claim 1, further comprising:
preparing in advance, a correlation between the element properties of said current control element and an optimal supply energy to be supplied to said current control element,
wherein said setting supply energy comprises:
setting said supply energy by use of said correlation and said extracted element properties.

3. The method according to claim 1, wherein said current control element is a fuse element,
wherein said extracting element properties comprises:
extracting a wiring resistance of said element property extraction pattern as the element properties of said current control element.

4. The method according to claim 1, wherein said current control element is a fuse element,
wherein said extracting element properties comprises:
extracting a via-contact resistance of said element property extraction pattern as the element properties of said current control element.

5. The method according to claim 1, wherein said fuse element has a via-contact,
wherein the method further comprises:
irreversibly cutting the electrical connection between the nodes by generating a void in a region of said via-contact with the supply energy.

6. The method according to claim 1, wherein said current control element is an anti-fuse element of a MOS structure,
wherein said extracting element properties comprises:
extracting a film thickness of a gate oxide film of said element property extraction pattern as the element properties of said current control element.

7. The method according to claim 2, wherein said preparing said correlation in advance comprises:
preparing the correlation of the element properties of said current control element and a minimum supply energy to said current control element to control the electrical connection between the nodes.

8. The method according to claim 7, wherein said preparing the correlation in advance comprises:
preparing the correlation of the element properties of said current control element and a maximum supply energy to said current control element to control the electrical connection between the nodes.

9. The method according to claim 1, wherein said extracting element properties comprises:
extracting the element properties of said element property extraction pattern as the element properties of said current control elements within a predetermined distance from said element property extraction pattern.

10. The method according to claim 1, wherein a storage section using said current control element is formed on said semiconductor wafer,
wherein said supplying the set supply energy comprises:
irreversibly writing a data into said storage section.

11. The method according to claim 1, wherein said element property extraction pattern is provided on a scribe region formed on said semiconductor wafer,
wherein the method further comprises:
deleting said element property extraction pattern by dicing.

12. A computer-readable recording medium in which a computer-executable program code is stored to attain a method of manufacturing a semiconductor device, which comprises:
extracting element properties of an element property extraction pattern formed on a semiconductor wafer as element properties of a current control element which is formed between nodes on said semiconductor wafer;
setting a supply energy to be supplied to said current control element in write of a data into said current control element, based on the extracted element properties; and
supplying the set supply energy to said current control element to irreversibly control an electrical connection between the nodes.

13. A data writing apparatus comprising:
an element property extracting section configured to measure an element property extraction pattern formed on a semiconductor wafer, and extract element properties of a current control element related to said element property extraction pattern from a measurement result;
a supply energy setting section configured to set a supply energy to be supplied to said current control element which is formed between nodes on said semiconductor wafer, based on said extracted element properties; and
a data writing section configured to write a data in said current control element by supplying the set supply energy to said current control element, and irreversibly controlling an electrical connection between said nodes through breakdown of said current control element.

14. The data writing apparatus according to claim 13, further comprising:
a memory section in which a correlation data is stored that indicates a relation of the element properties of said current control element and an optimal supply energy to be supplied to said current control element,
wherein said supply energy setting section uses said extracted element properties and said correlation data to set said supply energy to be supplied.

15. The data writing apparatus according to claim 13, wherein said current control element is a fuse element, and
wherein said element property extracting section extracts a wiring resistance of said element property extraction pattern as said element properties from the measurement result.

16. The data writing apparatus according to claim 13, wherein said current control element is a fuse element, and
wherein said element property extracting section extracts a via-contact resistance of said element property extraction pattern as said element properties from the measurement result.

17. The data writing apparatus according to claim 15, wherein said fuse element has a via-contact, and
wherein an electrical connection between said nodes is irreversibly cut by a void generated in a region where said via-contact is provided, with the supply energy.

18. The data writing apparatus according to claim 13, wherein said current control element is an anti-fuse element of a MOS (Metal Oxide Semiconductor) structure, and wherein said element property extracting section extracts a film thickness of a gate oxide film of said element property extraction pattern as the element properties from the measurement result.

19. The data writing apparatus according to claim 14, wherein said memory section stores as said correlation data, the relation of the element properties of said current control element and a minimum supply energy to be supplied to said current control element to control the electrical connection between the nodes.

20. The data writing apparatus according to claim 19, wherein said memory section stores as said correlation data, the relation of the element properties of said current control element and a maximum supply energy to be supplied to said current control element to control the electrical connection between the nodes.

21. The data writing apparatus according to claim 13, wherein said element property extracting section extracts the element properties of said current control elements within a predetermined distance from said element property extraction pattern.

22. A semiconductor device comprising:
a current control element formed on a semiconductor wafer, wherein a data is written in said current control element to control an electrical connection between nodes; and
a property extraction pattern formed on said semiconductor wafer and having the same element properties as said current control element,
wherein a distance between said current control element and said property extraction pattern is within a size of a semiconductor device on which said current control element is mounted.

23. The semiconductor device according to claim 22, wherein said property extraction pattern is formed in a scribe region which is removed through a dicing.

24. The semiconductor device according to claim 22, wherein said current control element is a fuse element having a via-contact, and
wherein the electrical connection between the nodes is irreversibly cut by generating a void in an region of said via-contact with a supply energy.

25. The semiconductor device according to claim 22, wherein said current control element is an anti-fuse element of a MOS (Metal Oxide Semiconductor) structure, in which an insulating film of the anti-fuse element is broken with a supply energy, and the electrical connection between the nodes is irreversibly controlled.

* * * * *